(12) United States Patent
Wang et al.

(10) Patent No.: US 12,211,698 B2
(45) Date of Patent: Jan. 28, 2025

(54) METHOD COMPOSITION AND METHODS THEREOF

(71) Applicant: Taiwan Semiconductor Manufacturing Co., Ltd., Hsin-Chu (TW)

(72) Inventors: Siao-Shan Wang, Tainan (TW); Cheng-Han Wu, Taichung (TW); Ching-Yu Chang, Yilang County (TW); Chin-Hsiang Lin, Hsin-Chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/889,448

(22) Filed: Jun. 1, 2020

(65) Prior Publication Data
US 2020/0335349 A1 Oct. 22, 2020

Related U.S. Application Data

(63) Continuation of application No. 15/628,355, filed on Jun. 20, 2017, now Pat. No. 10,672,619.

(60) Provisional application No. 62/434,811, filed on Dec. 15, 2016.

(51) Int. Cl.
| | | |
|---|---|---|
| *H01L 21/308* | (2006.01) | |
| *G03F 7/26* | (2006.01) | |
| *G03F 7/40* | (2006.01) | |
| *H01L 21/027* | (2006.01) | |

(52) U.S. Cl.
CPC ............ *H01L 21/3081* (2013.01); *G03F 7/26* (2013.01); *G03F 7/405* (2013.01); *H01L 21/0273* (2013.01)

(58) Field of Classification Search
CPC .... H01L 21/3086; H01L 21/0273; G03F 7/26
See application file for complete search history.

(56) References Cited

U.S. PATENT DOCUMENTS

| | | | |
|---|---|---|---|
| 4,902,897 | A | 2/1990 | Iwamatsu |
| 6,387,578 | B1 | 5/2002 | Lian et al. |
| 8,796,666 | B1 | 8/2014 | Huang et al. |
| 9,012,132 | B2 | 4/2015 | Chang |
| 9,028,915 | B2 | 5/2015 | Chang et al. |
| 9,093,530 | B2 | 7/2015 | Huang et al. |

(Continued)

FOREIGN PATENT DOCUMENTS

| | | |
|---|---|---|
| CN | 102347217 A | 2/2012 |
| CN | 102347218 A | 2/2012 |

(Continued)

*Primary Examiner* — Thomas T Pham
(74) *Attorney, Agent, or Firm* — HAYNES AND BOONE, LLP

(57) ABSTRACT

Provided is a material composition and method that includes forming a patterned resist layer on a substrate, where the patterned resist layer has a first line width roughness. In various embodiments, the patterned resist layer is coated with a treatment material, where a first portion of the treatment material bonds to surfaces of the patterned resist layer. In some embodiments, a second portion of the treatment material (e.g., not bonded to surfaces of the patterned resist layer) is removed, thereby providing a treated patterned resist layer, where the treated patterned resist layer has a second line width roughness less than the first line width roughness.

20 Claims, 8 Drawing Sheets

(56) References Cited

U.S. PATENT DOCUMENTS

| | | |
|---|---|---|
| 9,146,469 B2 | 9/2015 | Liu et al. |
| 9,213,234 B2 | 12/2015 | Chang |
| 9,223,220 B2 | 12/2015 | Chang |
| 9,256,133 B2 | 2/2016 | Chang |
| 9,280,051 B2 | 3/2016 | Wu et al. |
| 9,536,759 B2 | 1/2017 | Yang et al. |
| 9,548,303 B2 | 1/2017 | Lee et al. |
| 2003/0054658 A1* | 3/2003 | Liu ............... G03F 7/265 438/710 |
| 2003/0143490 A1* | 7/2003 | Kozawa ............ H01L 21/0273 430/315 |
| 2004/0069945 A1 | 4/2004 | Sheng et al. |
| 2009/0065866 A1 | 3/2009 | Larsen et al. |
| 2009/0130611 A1* | 5/2009 | Zandbergen ......... G03F 7/0392 430/325 |
| 2012/0219755 A1 | 8/2012 | Bae et al. |
| 2013/0095433 A1 | 4/2013 | Kim et al. |
| 2013/0129991 A1* | 5/2013 | Ndoye ............. H01L 21/0272 430/326 |
| 2014/0045335 A1* | 2/2014 | Koh ................ G03F 7/426 438/700 |
| 2014/0370709 A1 | 12/2014 | Wu et al. |
| 2015/0243558 A1* | 8/2015 | Anselm ............. H01S 5/0202 438/462 |
| 2016/0184839 A1* | 6/2016 | Tian ............... H01L 21/6708 438/745 |
| 2016/0238938 A1 | 8/2016 | Ban et al. |
| 2017/0088722 A1* | 3/2017 | Mori ................ G03F 7/405 |
| 2018/0174830 A1 | 6/2018 | Wang et al. |

FOREIGN PATENT DOCUMENTS

| | | |
|---|---|---|
| CN | 102681367 A | 9/2012 |
| KR | 20160026660 A | 3/2016 |
| TW | 344124 B | 11/1997 |
| TW | 420843 B | 2/2001 |

\* cited by examiner

METHOD COMPOSITION AND METHODS THEREOF

PRIORITY DATA

The present application is a continuation of U.S. patent application Ser. No. 15/628,355, filed Jun. 20, 2017, which claims the benefit of U.S. Provisional Application No. 62/434,811, filed Dec. 15, 2016, each of which is herein incorporated by reference in its entirety.

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Generally, the minimum feature size of a given semiconductor IC is a function of the wavelength of a radiation source used in a lithography process, as well as a resist composition and resist selectivity, among other factors. As semiconductor lithography has progressed, the wavelength of the radiation source used has decreased, and the radiation source itself may be relatively weak, such that photoresists have been designed to utilize radiation sources as efficiently as possible. As one example, chemically amplified photoresist (CAR) compositions have been introduced in an effort to increases a resist's sensitivity to an exposing light source. However, CAR systems have encountered limitations which are difficult to overcome, such as poor photon absorption in thin films, moderate etch selectivity, and limited gains in resolution. Moreover, the need for photoresists with high resolution, low line width roughness (LWR), and high sensitivity has increased more rapidly than the capability provided by such CAR systems. As such, chemically amplified resists alone may not be able to satisfy the next generation lithography requirements demanded by the continued advances in semiconductor technology.

Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figures 1A, 1B:
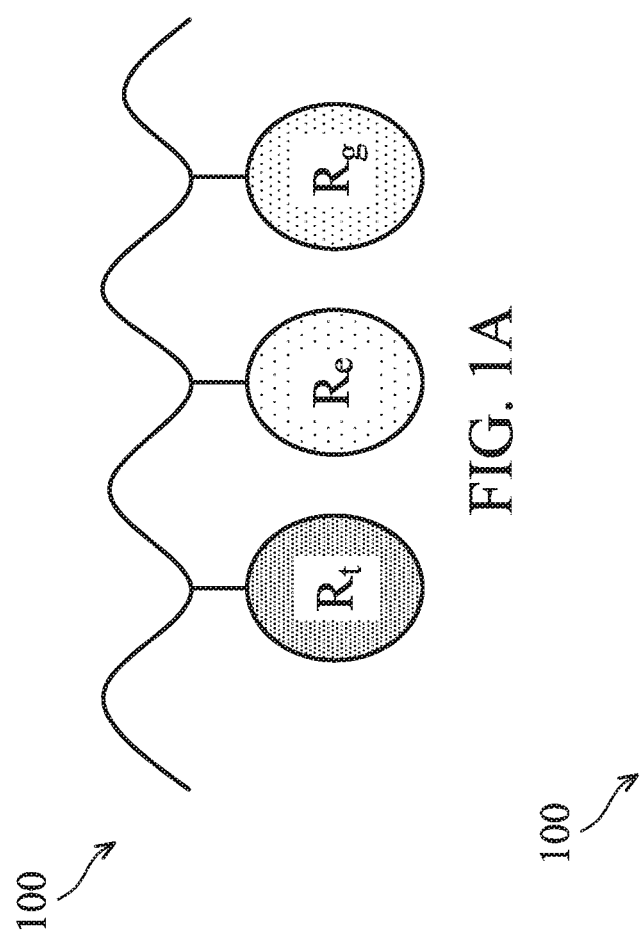
FIGS. 1A and 1B illustrate various aspects of a treatment material, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to methods for semiconductor device fabrication, and more particularly to material compositions and/or complexes for treatment of a photoresist (resist) material in extreme ultraviolet (EUV) lithography, and methods of using the same. In some cases, the embodiments shown and described herein may also be used for treatment of a resist material in deep UV (DUV) and electron beam (e-beam) lithography. Generally, lithographic patterning includes coating a substrate with a resist film, exposing the resist film to a radiation source (e.g., DUV, UV, or e-beam radiation source), and developing the exposed resist in a developer (a chemical solution). The developer removes portions of the exposed resist, such as exposed portions of a positive-tone resist or unexposed portions of a negative-tone resist, thereby forming a patterned resist layer. The patterned resist layer may then be used as an etch mask in a subsequent etching processes, transferring the pattern of the patterned resist layer to an underlying material layer. Alternatively, the resist pattern is used as an ion implantation mask in a subsequent ion implantation process applied to the underlying material layer, such as an epitaxial semiconductor layer.

Generally, the minimum feature size of a given semiconductor IC is a function of the wavelength of the radiation source used in the lithography process, as well as the resist composition and resist selectivity, among other factors. As semiconductor lithography has progressed, the wavelength of the radiation source used has decreased, for example from 248 nm (e.g., for a KrF laser) to 193 nm (e.g., for an ArF laser) for DUV lithography, and to 13.5 nm for EUV lithography. Radiation sources (light sources) used to produce these wavelengths of light may be relatively weak, such that photoresists have been designed to utilize these light sources as efficiently as possible. Conventionally, this goal has been achieved in part by the use of chemically amplified photoresists, where such chemical amplification increases a resist's sensitivity to the exposing light source. Currently, most semiconductor companies use chemically amplified resists (CAR) for high-volume manufacturing (HVM). Chemically amplified resists have been used for 248 nm (e.g., for a KrF laser) and 193 nm (e.g., for an ArF laser) DUV lithography, as well as for 13.5 nm EUV lithography, but the need for photoresists with higher resolution, lower line width roughness (LWR), and higher sensitivity has increased more rapidly than the capability provided by such resist systems. Adding to the challenge is the so-called "RLS tradeoff", which is a name given to the very difficult task of trying to simultaneously optimize resolution, LWR, and sensitivity. Thus, existing methods have been lacking, and may not be able to adequately satisfy next generation lithography requirements.

Embodiments of the present disclosure offer advantages over the existing art, though it is understood that other embodiments may offer different advantages, not all advantages are necessarily discussed herein, and no particular advantage is required for all embodiments. Generally, and in accordance with embodiments disclosed herein, a material composition and method for treating a resist material, and thereby improving at least LWR and local critical dimension uniformity (LCDU), is provided. In various embodiments, the material composition may be used to treat the resist material as part of an in-situ treatment process or as part of a post-treatment process, as described in more detail below.

Figure 2A:
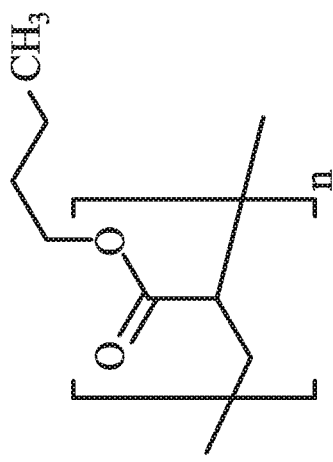
FIGS. 2A, 2B, 2C, 2D, 2E, and 2F illustrate examples of a treatment monomer ($R_t$), in accordance with some embodiments.
Figure 2B:
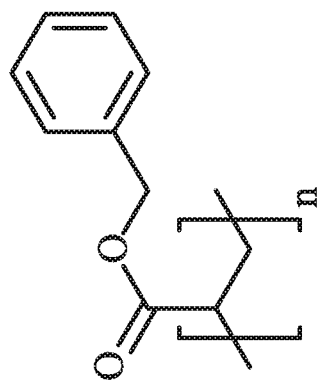
Figure 2C:
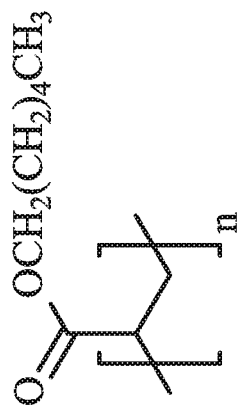
Figure 2D:
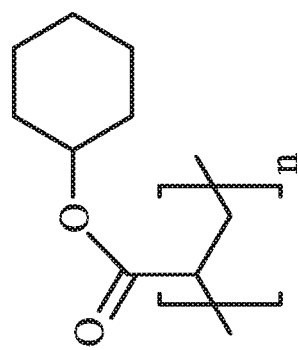
Figure 2E:
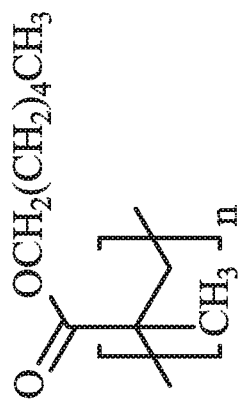
Figure 2F:
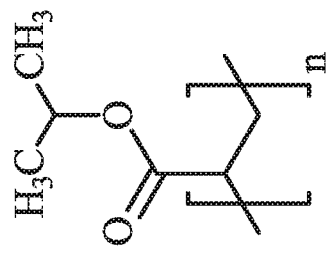
Figure 3C:
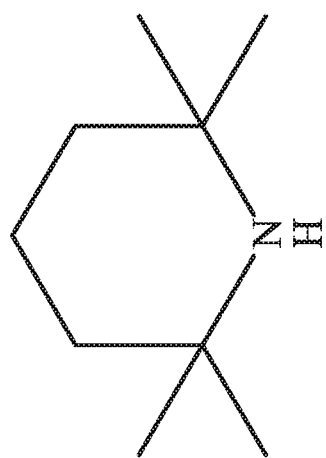
FIGS. 3A, 3B, and 3C illustrate examples of a grafting monomer ($R_g$), in accordance with some embodiments.
Figure 3B:
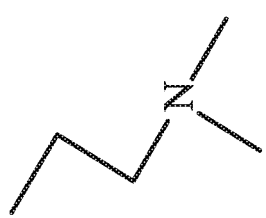
Figure 3A:
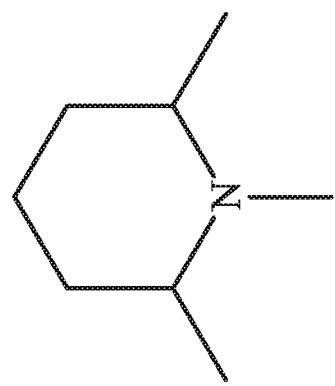
Figure 4C:
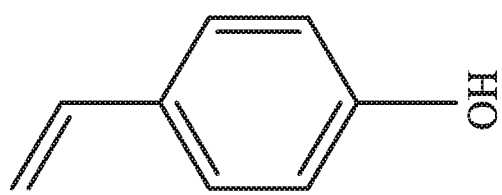
FIGS. 4A, 4B, and 4C illustrate examples of an etching resistance monomer ($R_e$), in accordance with some embodiments.
Figure 4B:
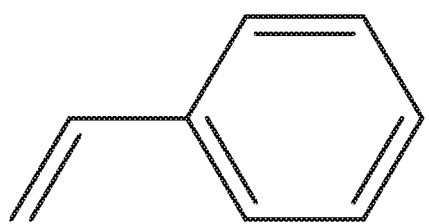
Figure 4A:
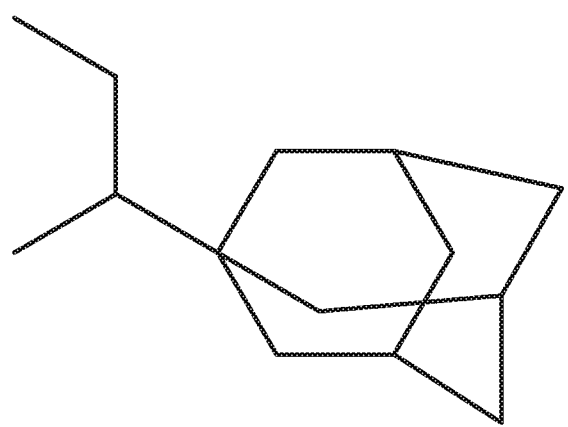

With reference to the example of FIGS. 1A and 1B, illustrated therein is a treatment material 100, in accordance with some embodiments. In various embodiments, the material composition for treating the resist material (e.g., the treatment material 100) may include one or more of a treatment monomer ($R_t$), a grafting monomer ($R_g$), and an etching resistance monomer ($R_e$). By way of example, the treatment monomer ($R_t$) may include an organic compound such as an aliphatic compound. In some embodiments, the treatment monomer ($R_t$) may include a C4-C20 alkyl group, a cycloalkyl group, a C4-C20 saturated or unsaturated hydrocarbon ring or a C5-C20 heterocyclic group which may include a 2-D or 3-D structure. Additionally, in some embodiments, the glass transition temperature (Tg) of the treatment monomer ($R_t$) may be below about 80 degrees Celsius. In some cases, the glass transition temperature (Tg) of the treatment monomer ($R_t$) may be below about 50 degrees Celsius. Additional examples of the treatment monomer ($R_t$) are provided in FIGS. 2A-2F. For example, the treatment monomer ($R_t$) may include poly(butyl acrylate) (e.g., FIG. 2A) with a Tg of about 220 degrees Kelvin (e.g., about −53 degrees Celsius), poly(benzyl acrylate) (e.g., FIG. 2B) with a Tg of about 277 degrees Kelvin (e.g., about 4 degrees Celsius), poly(hexyl acrylate) (e.g., FIG. 2C) with a Tg of about 215 degrees Kelvin (e.g., about −58 degrees Celsius), poly(cyclohexyl acrylate) (e.g., FIG. 2D) with a Tg of about 288 degrees Kelvin (e.g., about 15 degrees Celsius), poly(hexyl methacrylate) (e.g., FIG. 2E) with a Tg of about 268 degrees Kelvin (e.g., about −5 degrees Celsius), or poly(isopropyl acrylate) (e.g., FIG. 2F) with a Tg of about 271 degrees Kelvin (e.g., about −2 degrees Celsius). In some embodiments, the grafting monomer ($R_g$) may interact with an acid, and as such the grafting monomer (Rg) may include a base such as a monomer having a given basicity. Thus, in some embodiments, the acid dissociation constant, $pK_a$ of the grafting monomer ($R_g$) is greater than 7 and less than 13. In at least some embodiments, the $pK_a$ of the grafting monomer ($R_g$) is greater than 7 and less than 10. In some examples, the grafting monomer ($R_g$) may include one or more functional groups such as an $NH_3$ group, a 1°-3° amine group, an $OH^-$ group, an $NCS^-$ group, an alkenyl group, a phenol group, a C5-C20 heterocyclic group, or a CN group. Additional examples of the grafting monomer ($R_g$) are provided in FIGS. 3A-3C. By way of example, the etching resistance monomer ($R_e$) has a high etch resistance and includes an aromatic compound. In some cases, the etching resistance monomer ($R_e$) includes at least one of styrene and a phenolic compound. Additional examples of the etching resistance monomer ($R_e$) are provided in FIGS. 4A-4C.

In various embodiments, the treatment material 100 has a molecular weight (MW) that is less than about 20,000. In at least some cases, the treatment material 100 has a MW that is less than about 10,000. In some embodiments, the unit of MW is grams per mole. Additionally, in some embodiments, the treatment material 100 may include a polymer chain including a block copolymer or a random copolymer. By way of example, a solvent system (e.g., used to remove the treatment material 100) may include an organic solvent. In some cases, the solvent system may include one or more of n-butyl acetate (nBA), 2-heptanone, and Isoamyl acetate (IAA). In some embodiments, the partition coefficient (Log P) of the solvent system is greater than 1.82. Referring once again to FIG. 1B, and in some examples, a chemical structure of the treatment material 100 may include the grafting monomer ($R_g$), the etching resistance monomer ($R_e$), and the treatment monomer ($R_t$) bonded to $A_3$, $A_2$ and $A_1$, respectively, where each of $A_1$, $A_2$ and $A3$ may be COO— or PhO—. $A_1$, $A_2$ and A3 may in turn be bonded to a chemical backbone as part of chemicals X, Y and Z, respectively. In some embodiments, the mole ratios of X to Y to Z are described by X+Y+Z=1.0, 0.1<X<0.9, 0.25<Y<0.5, and 0<Z<1. $X_a$, $X_b$ and $X_c$, which are also bonded to the backbone, may be hydrogen or methyl.

Figure 5:
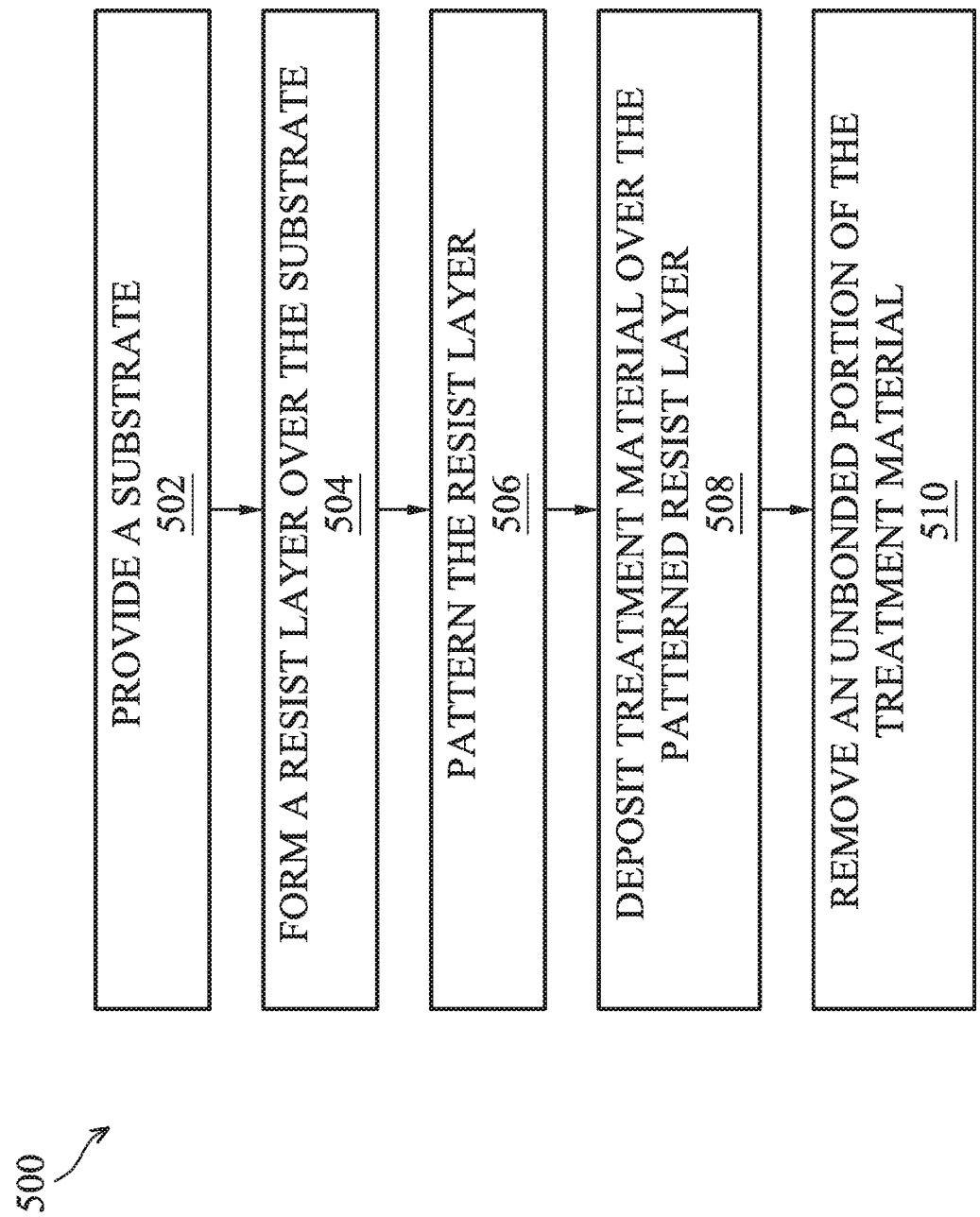
FIG. 5 illustrates a flow chart of a method for using the treatment material as part of a post-treatment process, according to various embodiments.

As noted above, the treatment material may 100 be used to treat the resist material as part of a post-treatment process or as part of an in-situ treatment process. With reference now to FIG. 5, shown therein is a flow chart of a semiconductor manufacturing method 500, illustrating use of the treatment material 100 as part of a post-treatment process. Additional steps may also be provided before, during, and after the method 500, and some steps described can be replaced, eliminated, or moved before or after other steps for additional embodiments of the method. It is also noted that the method 500 is exemplary, and is not intended to limit the present disclosure beyond what is explicitly recited in the claims that follow. The method 500 will be further described below in conjunction with FIGS. 6A-6C.

In various embodiments, the method 500 begins at block 502 where a substrate 602 is provided. By way of illustration, the substrate 602 may include a bulk layer 604 and one or more layers 606, 608 formed thereon. In some examples, the bulk layer 604 includes a semiconductor wafer, such as a silicon wafer. Additionally, in some embodiments, the substrate 602 may include various layers, including conductive or insulating layers formed on a semiconductor substrate (e.g., on the bulk layer 604). The bulk layer 604 and/or the one or more layers 606, 608 may further include various doping configurations depending on design requirements as is known in the art. The bulk layer 604 and/or the one or more layers 606, 608 may also include other semiconductors such as germanium, silicon carbide (SiC), silicon germanium (SiGe), or diamond. Alternatively, the bulk layer 604 and/or the one or more layers 606, 608 may include a compound semiconductor and/or an alloy semiconductor. Further, the bulk layer 604 and/or the one or more layers 606, 608 may optionally include an epitaxial layer (epi-layer), may be strained for performance enhancement, may include a silicon-on-insulator (SOI) structure, and/or have other suitable enhancement features.

In some embodiments, the substrate 602 includes a metal, a metal alloy, a metal nitride, a sulfide, a selenide, an oxide, and/or a silicide with the formula 'MXa', where M is a metal and X is N, S, Se, O, or Si with 'a' equal to about 0.4-2.5. For example, in at least some embodiments, the substrate 602 includes one or more of Ti, Al, Co, Ru, TiN, WN2, and TaN. Alternatively, in some embodiments, the substrate 602 includes Si, a metal oxide, and/or a metal nitride with the formula 'MXb', where M is a metal or Si, and X is N or O with 'b' equal to about 0.4-2.5. For example, in at least some embodiments, the substrate 602 includes one or more of SiO2, silicon nitride, aluminum oxide, hafnium oxide, and lanthanum oxide.

Generally, and in some embodiments, the substrate 602 may include an underlayer (or material layer) to be processed (e.g., to be patterned or to be implanted). In some examples, the bulk layer 604 itself is to be processed. In some embodiments, the underlayer may include the one or more layers 606, 608. In some cases, the underlayer may include a hard mask layer to be patterned. In some examples, the underlayer may include an epitaxial semiconductor layer to be ion implanted. In an embodiment, the underlayer may include a hard mask layer including material(s) such as silicon oxide, silicon nitride (SiN), silicon oxynitride, titanium nitride, or other suitable material or composition. In some embodiments, the underlayer may include an anti-reflection coating (ARC) layer such as a nitrogen-free anti-reflection coating (NFARC) layer including material(s) such as silicon oxide, silicon oxygen carbide, or plasma enhanced chemical vapor deposited silicon oxide. In various embodiments, the underlayer may include a high-k dielectric layer, a gate layer, a hard mask layer, an interfacial layer, a capping layer, a diffusion/barrier layer, a dielectric layer, a conductive layer, other suitable layers, and/or combinations thereof. While some examples of underlayers have been given, such examples are not meant to be limiting, and other suitable underlayers may be equally used without departing from the scope of the present disclosure.

The method 500 proceeds to block 504 where a photoresist layer (or simply a resist layer) is formed over the substrate 602, or over the underlayer disposed on the substrate 602. In various examples, the resist layer may include at least a polymer, a photoacid generator (PAG), a quencher (base), and a solvent. In some embodiments, the resist layer includes a positive tone resist including an acid-cleavable polymer. By way of example, the PAG may release acid after optical exposure (e.g., UV exposure), and the released acid may then cleave the acid-cleavable polymer in a subsequent post exposure baking (PEB) step. In some examples, after the acid cleaves the acid-cleavable polymer, the polymer (e.g., the resist) may become more hydrophilic, and the polymer may not be able to be dissolved (e.g., by a solvent or basic solution). In some embodiments, the resist layer may alternatively include a negative tone resist including at least one of an acid catalyzed cross-linkable polymer and a polymeric pinacol. By way of example, the PAG may release acid after optical exposure (e.g., UV exposure), and the released acid may then catalyze the cross-linking of the acid catalyzed cross-linkable polymer or the pinacol rearrangement of the polymeric pinacol. In some examples, after the cross linking or the pinacol rearrangement, the polymer (e.g., the resist) may become more hydrophobic, and the polymer may not be able to be dissolved (e.g., by a basic solution). In some cases, the resist layer may further include a surfactant, a chromophore, and a cross-linker. In some embodiments, the photoresist polymer may have a molecular weight (MW) between about 1,000 to about 20,000. In various embodiments, the resist layer is sensitive to radiation used in a lithography exposure process and has a resistance to etching processes (or ion implantation processes). In some embodiments, the resist layer may be formed by a spin-on coating process. In some examples, prior to forming the resist layer, an adhesion layer (e.g., such as an HMDS layer) is formed over the substrate, or over the optional underlayer disposed on the substrate. In some embodiments, after formation of the resist layer, and prior to performing an exposure process, a pre-bake process may be performed, for example, to evaporate solvents and to densify the resist layer. In various embodiments, the resist layer is sensitive to various types of radiation, such as DUV radiation (e.g., 248 nm radiation from a KrF laser or 193 nm radiation from an ArF laser), EUV radiation (e.g., 13.5 nm radiation), an electron beam (e-beam), or an ion beam. Generally, in various embodiments, the resist layer may be sensitive to radiation having a wavelength less than about 250 nm. In some embodiments, the resist may include a tri-layer stack that includes a resist layer over a bottom anti-reflective coating (BARC) layer over an organic underlayer.

The method 500 proceeds to block 506 where the resist layer is patterned. Generally, after formation of the resist layer, a pattern is exposed onto the resist-coated substrate. For example, in various embodiments, the resist layer may be exposed (e.g., by a lithographic imaging system) through an intervening mask. In some embodiments, the resist layer is exposed by EUV radiation (e.g., 13.5 nm). Alternatively, in some embodiments, the resist layer may be exposed by DUV radiation (e.g., from a 248 nm KrF excimer laser or a 193 nm ArF excimer laser), X-ray radiation, an e-beam, an ion beam, and/or other suitable radiation sources. In various examples, the exposure of the resist layer may be performed in air, in a liquid (e.g., immersion lithography), or in a vacuum (e.g., for EUV lithography and e-beam lithography). In some embodiments, the radiation beam is patterned with a mask, such as a transmissive mask or a reflective mask, which may include resolution enhancement features such as phase-shifting features and/or optical proximity correction (OPC), and which may be performed using off-axis illumination (OAI). In some other embodiments, the radiation beam is directly modulated with a predefined pattern, such as an IC layout, without using a mask (such as using a digital pattern generator or direct-write mode).

In some embodiments, after exposure of the pattern onto the resist-coated substrate, a baking process may be performed. For example, in some embodiments, after exposure of the resist layer, and prior to performing a resist development process, a post-bake process may be performed to stabilize and harden the developed resist layer. In some examples, as a result of the exposure process, a latent pattern is formed in the resist layer. By way of example, the latent pattern refers to the exposed pattern on the resist layer, which will subsequently become a physical resist pattern, after a developing process. In various embodiments, the latent pattern of the resist layer may include unexposed portions and exposed portions of the resist layer. In various embodiments, the exposed portions of the resist layer may be physically or chemically changed as a result of the exposure process. In some embodiments, if a positive-tone resist has been used, the exposed portions will be dissolved during a subsequent development process. In some cases, if a negative-tone resist has been used, the exposed portions will become insoluble and a subsequent development process may instead dissolve the unexposed portions.

Figure 6A:
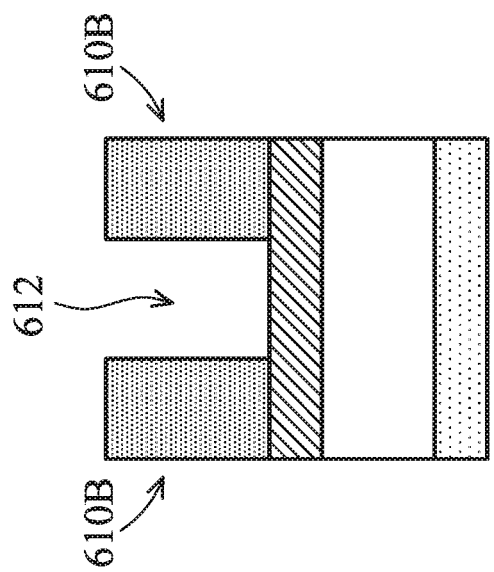
FIGS. 6A, 6B, and 6C provide cross-sectional views of a semiconductor structure at various fabrication stages, constructed in accordance with the method of FIG. 5.
Figure 6B:
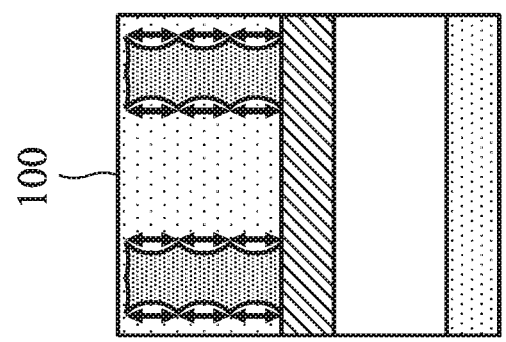
Figure 6C:
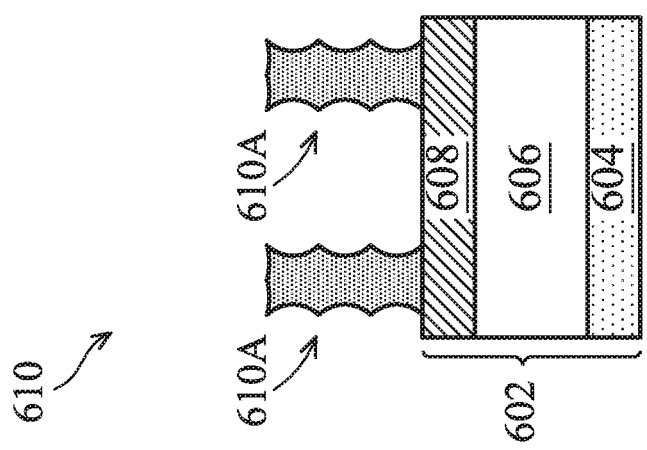

In some embodiments, after the baking process, a development process is performed to form a patterned resist layer, as shown in FIG. 6A. For example, after formation of the latent image and in various embodiments, a resist development process is performed, resulting in a patterned resist layer 610 over the substrate 602. In some embodiments, the resist development process includes a wet chemical development process, as known in the art. As discussed above, if a positive-tone resist has been used, the exposed portions will be dissolved during the development process, and if a negative-tone resist has been used, the exposed portions will be insoluble and instead the unexposed portions will be removed. In at least some existing processes, the patterned resist layer may include resist patterns having significant line width roughness (LWR) (e.g., presenting as rough line edges 610A of the patterned resist layer 610) and/or poor local critical dimension uniformity (LCDU), which may be a result of the LWR.

The method 500 proceeds to block 508 where the treatment material is deposited over the patterned resist layer. With reference to the example of FIG. 6B, and in an embodiment of block 508, the treatment material 100 may be deposited over the patterned resist layer 610, thereby coating the patterned resist layer 610 and the rough line edges 610A of the patterned resist layer. In some embodiments, the treatment material 100 may be deposited by a spin-coating process or other suitable process. In some embodiments, after deposition of the treatment material 100 onto the patterned resist layer 610, a baking step is optionally performed. In various embodiments, the treatment material 100 may bond to surfaces of the patterned resist layer 610, including surfaces of the rough line edges 610A of the patterned resist layer 610. In some examples, the treatment material 100 bonds to the surfaces of the patterned resist layer 610 by way of hydrogen bonding, ionic bonding, or covalent bonding.

The method 500 proceeds to block 510 where an unbonded portion of the treatment material is removed. With reference to the example of FIG. 6C, and in an embodiment of block 510, after the coating and optional baking of the treatment material 100, an unbonded portion of the treatment material 100 is removed. For example, the unbonded portion of the treatment material 100 may be removed using a solvent system (e.g., a solvent material) including one or one or more of n-butyl acetate (nBA), 2-heptanone, and Isoamyl acetate (IAA). In some embodiments, the partition coefficient (Log P) of the solvent material is greater than 1.82. In various examples, portions of the treatment material 100 not bonded to the patterned resist material 610 are removed (e.g., portions of the treatment material 100 not in contact with the resist material), while portions of the treatment material 100 that are bonded to the patterned resist material 610 remain bonded to the resist material during the treatment material removal process. After removal of the treatment material and as a result of the bonding of the treatment material to the patterned resist layer, the treated patterned resist layer includes resist patterns having minimal line width roughness (LWR) and excellent local critical dimension uniformity (LCDU). Stated another way, the treated patterned resist layer includes patterns having a lower LWR than the untreated patterned resist layer. Thus, the treated patterned resist layer also has substantially smooth line edges and surfaces 610B, compared to the rough edges and surfaces 610A of the untreated patterned resist layer.

In some examples, after the treatment process and formation of the treated patterned resist layer, a fabrication process may be performed to the exposed substrate or underlayer through openings 612 of the treated patterned resist layer, where the treated patterned resist layer is used as a mask. In some embodiments, such a fabrication process may include an etching process applied to the underlayer using the treated patterned resist layer as an etch mask, thereby transferring the pattern from the treated patterned resist layer to the underlayer. Alternatively, in some embodiments, the fabrication process may include an ion implantation process using the treated patterned resist layer as an ion implantation mask, thereby forming various doped features (e.g., within the underlayer). In some embodiments, other fabrication processes may alternatively be performed while using the treated patterned resist layer as a mask.

Figure 7:
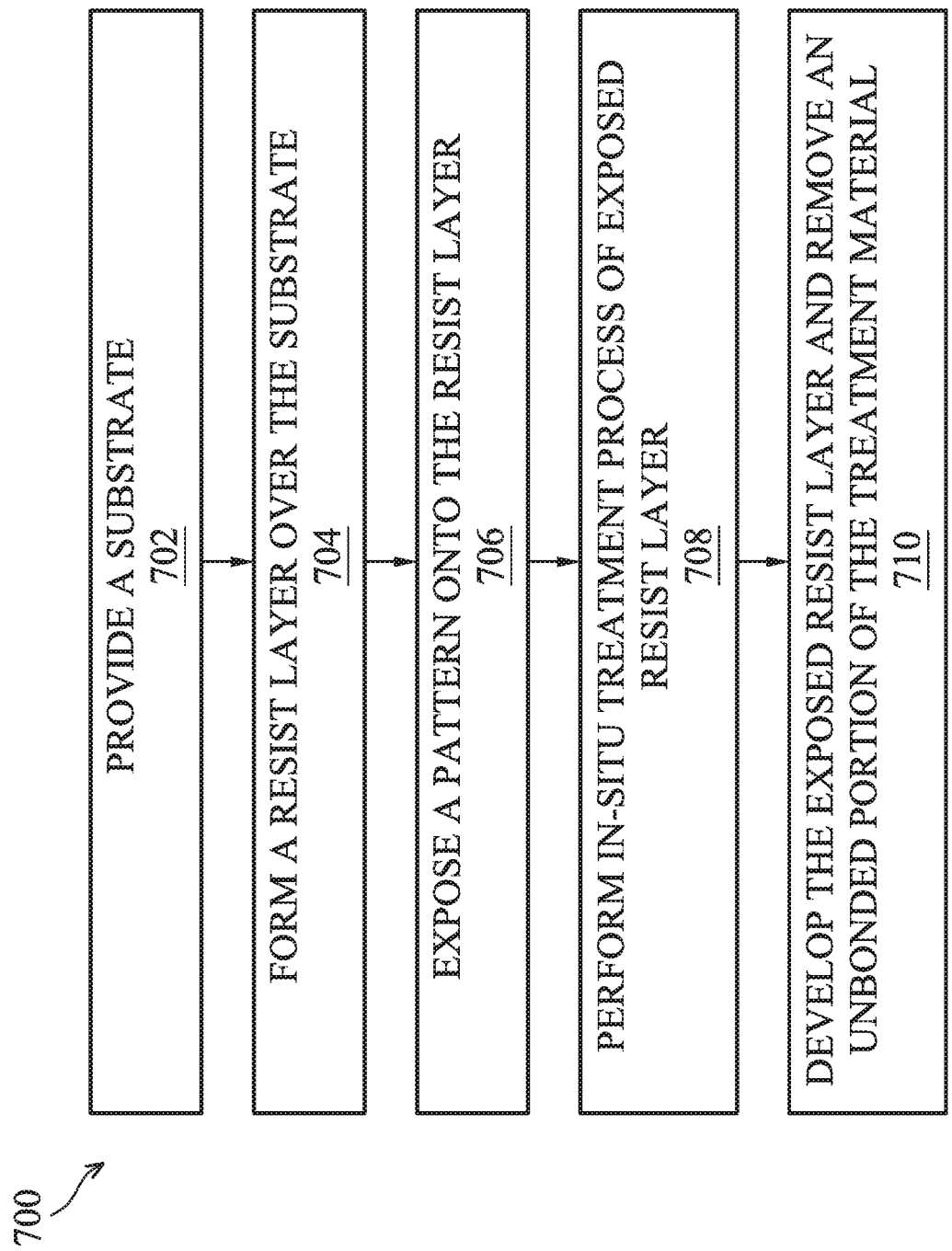
FIG. 7 illustrates a flow chart of a method for using the treatment material as part of an in-situ treatment process, according to various embodiments.

With reference now to FIG. 7, shown therein is a flow chart of a semiconductor manufacturing method 700, illustrating use of the treatment material 100 as part of an in-situ treatment process. Additional steps may also be provided before, during, and after the method 700, and some steps described can be replaced, eliminated, or moved before or after other steps for additional embodiments of the method. It is also noted that the method 700 is exemplary, and is not intended to limit the present disclosure beyond what is explicitly recited in the claims that follow. The method 700 will be further described below in conjunction with FIGS. 8A-8D.

Figures 8A, 8B, 8C, 8D:
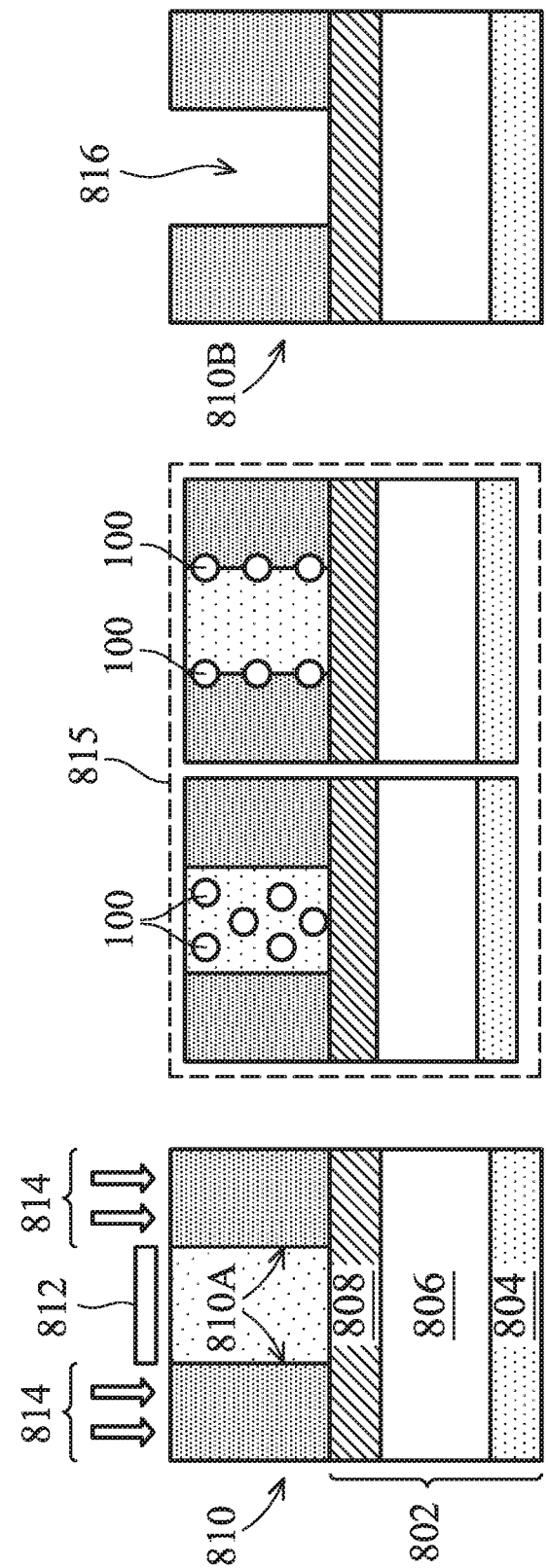
FIGS. 8A, 8B, 8C, and 8D provide cross-sectional views of a semiconductor structure at various fabrication stages, constructed in accordance with the method of FIG. 7.

In various embodiments, the method 700 begins at block 702 where a substrate 802 is provided. By way of illustration, the substrate 802 may include a bulk layer 804 and one or more layers 806, 808 formed thereon. In various embodiments, the substrate 802, including the one or more layers 806, 808, may be substantially as described above. For example, the substrate 802 may include an underlayer (or material layer) to be processed (e.g., to be patterned or to be implanted). In some examples, the bulk layer 804 itself is to be processed. In some embodiments, the underlayer may include the one or more layers 806, 808. The method 700 proceeds to block 704 where a resist layer is formed over the substrate. In various embodiments, a resist layer 810 is formed over the substrate 802, or over the underlayer disposed on the substrate 802, as shown in FIG. 8A. The resist layer may be substantially the same as previously described. In some embodiments, after formation of the resist layer 810, and prior to performing an exposure process, a pre-bake process may be performed, for example, to evaporate solvents and to densify the resist layer 810. In various embodiments, the resist layer 810 is sensitive to various types of radiation, as described above.

The method 700 proceeds to block 706 where a pattern is exposed onto the resist layer. Referring again to FIG. 8A, a pattern is exposed onto the resist-coated substrate through an intervening mask 812 and using a radiation source 814, substantially in a manner as described above. In some embodiments, after exposure of the pattern onto the resist-coated substrate, a baking process may be performed (e.g., post-exposure bake). For example, in some embodiments, after exposure of the resist layer, and prior to performing a resist development process, a post-bake process may be performed to stabilize and harden the developed resist layer. In some examples, as a result of the exposure process, a latent pattern is formed in the resist layer, as described above. In at least some existing processes, the latent pattern may include a pattern having significant line width roughness (LWR) (e.g., presenting as rough line edges 810A of the latent pattern).

The method 700 proceeds to block 708 where an in-situ treatment process of the resist layer is performed. In accordance with some embodiments, an in-situ treatment process 815 of the resist layer (e.g., using the treatment material) is performed after the exposure and post-exposure bake processes, and before a subsequent development process. Stated another way, an in-situ treatment process of the resist layer (e.g., using the treatment material) is performed after formation of the latent pattern, and before a subsequent development process. In some embodiments, the treatment material disclosed herein may be deposited over the patterned resist layer, for example, by a spin-coating process, a vapor deposition process, or other suitable process. With reference to FIGS. 8B and 8C, and by the in-situ treatment process 815 of block 708, the treatment material 100 may diffuse through portions of the exposed or unexposed layers of the resist 810, thereby coating sidewalls of the latent pattern within the resist layer (e.g., including rough line edges 810A of the latent pattern). In various embodiments, the treatment material 100 may bond to surfaces of the latent pattern within the resist layer by way of hydrogen bonding, ionic bonding, or covalent bonding.

The method 700 proceeds to block 710 where a development process is performed and an unbonded portion of the treatment material is removed. In some embodiments, after the in-situ treatment process of block 708, a development process is performed to form a patterned resist layer 810B, as shown in FIG. 8D. Stated another way, after formation of the latent image and after the in-situ treatment process, a resist development process is performed, resulting in the treated patterned resist layer 810B, similar to the treated patterned resist layer described above. In some embodiments, the resist development process is as described above. Additionally, in some embodiments, the resist development process may remove portions of the treatment material 100 not in contact with sidewalls of the latent pattern within the resist, while portions of the treatment material 100 that are bonded to surfaces of the latent pattern within the resist remain bonded to the resist material after the development process. In some cases, a baking process may be performed after the development process. Thus, after the development process, and as a result of the in-situ treatment process, the treated patterned resist layer 810B includes resist patterns having minimal line width roughness (LWR) and excellent local critical dimension uniformity (LCDU). Stated another way, the treated patterned resist layer 810B includes patterns having a lower LWR than an untreated patterned resist layer, and for example, a lower LWR than the LWR of the latent pattern. Thus, the treated patterned resist layer also has substantially smooth line edges and surfaces, compared to the rough edges and surfaces of an untreated patterned resist layer and compared to the rough edges and surfaces of the latent pattern. In some examples, after the in-situ treatment process and formation of the treated patterned resist layer, a fabrication process may be performed to the exposed substrate or underlayer through openings 816 of the treated patterned resist layer, as described above.

As discussed above, additional steps may also be provided before, during, and after the methods 500 and/or 700, and some steps described can be replaced, eliminated, or moved before or after other steps for additional embodiments of the method. For example, in an embodiment, the substrate 602 or the substrate 802 includes a semiconductor substrate and the methods 500 and/or 700 proceed to forming fin field effect transistor (FinFET) devices. In such an example, the methods 500 and/or 700 may further include forming a plurality of active fins in the semiconductor substrate. Additionally, and in furtherance of this example, the methods 500 and/or 700 may further include etching the semiconductor substrate to form trenches in the semiconductor substrate; filling the trenches with a dielectric material; performing a chemical mechanical polishing (CMP) process to form shallow trench isolation (STI) features; epitaxial growth and/or recessing of the STI features to form fin-like active regions. In some embodiments, the methods 500 and/or 700 include other steps to form a plurality of gate electrodes, gate spacers, doped source/drain regions, contacts for gate/source/drain features, etc. In some embodiments, subsequent processing may form various contacts/vias/lines and multilayers interconnect features (e.g., metal layers and interlayer dielectrics) on the substrate, configured to connect the various features to form a functional circuit that may include one or more devices (e.g., one or more FinFET devices). In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Those of ordinary skill in the art having benefit of this disclosure will recognize other embodiments and applications of the treatment material, without departing from the scope of the present disclosure.

It is also noted that the treatment material and methods of the present disclosure are not limited to a particular substrate type, mask type, resist type, radiation source (e.g., radiation wavelength), and/or lithography system type. For example, the treatment material and methods thereof may be applied to resist used to pattern features and/or devices on a variety of substrate materials such as silicon, germanium, silicon carbide (SiC), silicon germanium (SiGe), diamond, compound semiconductors, alloy semiconductors, and the substrate may optionally include one or more epitaxial layers (epi-layers), may be strained for performance enhancement, may include a silicon-on-insulator (SOI) structure, and/or have other suitable enhancement features. Embodiments of the present disclosure may further be applicable to processes employing reflective masks (e.g., such as used for extreme ultraviolet (EUV) lithography), transmissive masks, binary intensity masks, phase-shifting masks, as well as other mask types known in the art. In some examples, embodiments disclosed herein may be applied to processes employing various types of resist such as poly(methyl methacrylate) (PMMA), SU-8, an EUV resist, a positive-tone resist, a negative-tone resist, or other types of resist as known in the art. Additionally, embodiments of the present disclosure are applicable to various lithography system/aligner types such as a contact aligner, a proximity aligner, a projection aligner, or an EUV lithography system. Thus, embodiments of the present disclosure may further be applicable to systems employing any of a variety of radiation sources (radiation wavelengths) such as UV light, deep UV (DUV) light, EUV light, or other radiation sources as known in the art.

The various embodiments described herein offer several advantages over the existing art. It will be understood that not all advantages have been necessarily discussed herein, no particular advantage is required for all embodiments, and other embodiments may offer different advantages. For example, embodiments discussed herein include a material composition and method for treating a resist material, and thereby improving at least LWR and local critical dimension uniformity (LCDU). In various embodiments, the material composition may be used to treat the resist material as part of an in-situ treatment process or as part of a post-treatment process. In particular, as a result of the material composition and treatment methods disclosed herein, embodiments of the present disclosure provide for treated patterned resist layers having substantially smoother line edges and surfaces compared to the rougher edges and surfaces of untreated patterned resist layers. Thus, embodiments of the present disclosure serve to overcome various shortcomings of at least some current resist compositions and methods.

Thus, one of the embodiments of the present disclosure described a method that includes forming a patterned resist layer on a substrate, where the patterned resist layer has a first line width roughness. In various embodiments, the patterned resist layer is coated with a treatment material, where a first portion of the treatment material bonds to surfaces of the patterned resist layer. In some embodiments, a second portion of the treatment material (e.g., not bonded to surfaces of the patterned resist layer) is removed, thereby providing a treated patterned resist layer, where the treated patterned resist layer has a second line width roughness less than the first line width roughness.

In another of the embodiments, discussed is a method where a resist layer is exposed on a substrate to form a latent pattern within the resist layer. Thereafter, an in-situ treatment process of the exposed resist layer is performed, where the in-situ treatment process deposits a treatment material within the exposed resist layer and on sidewalls of the latent pattern. In various examples, after performing the in-situ treatment process, the exposed resist layer is developed to provide a treated patterned resist layer.

In yet another of the embodiments, discussed is a method of semiconductor device fabrication including forming a resist layer over a substrate. In some embodiments, an exposure process is performed to the resist layer, where the exposure process is performed using an EUV light source and projected onto the resist layer through an intervening mask including a circuit pattern. In various examples, after performing the exposure process, the exposed resist layer is developed to form a patterned resist layer, where the patterned resist layer includes the circuit pattern, and where the patterned resist layer has a first line width roughness. Thereafter, the patterned resist layer is coated with a treatment material, where a first portion of the treatment material bonds to surfaces of the patterned resist layer. In some embodiments, a second portion of the treatment material is removed to provide a treated patterned resist layer, where the treated patterned resist layer has a second line width roughness less than the first line width roughness.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a resist layer over a material layer;
   forming a pattern in the resist layer by exposing the resist layer to a radiation source, wherein the pattern in the resist layer is formed by an exposed portion of the resist layer and an unexposed portion of the resist layer, wherein the unexposed portion of the resist layer is adjacent to an edge of the exposed portion of the resist layer;
   before developing the resist layer to remove the unexposed portion of the resist layer, performing an in-situ treatment process that includes depositing a treatment material on the resist layer having the pattern formed therein by the exposed portion of the resist layer and the unexposed portion of the resist layer, wherein the treatment material diffuses into the exposed portion of the resist layer and the unexposed portion of the resist layer, wherein the treatment material includes a first monomer, a second monomer different than the first monomer, and a third monomer different than both the first monomer and the second monomer, wherein the third monomer includes a material selected from the group consisting of a styrene and a phenolic compound; and
   after performing the in-situ treatment process, developing the resist layer to remove the treatment material and the unexposed portion of the resist layer, thereby providing a treated, patterned resist layer formed by the treated, exposed portion of the resist layer.

2. The method of claim 1, wherein the treatment material diffuses to and coats sidewalls of the exposed portion of the resist layer.

3. The method of claim 1, wherein the depositing the treatment material includes a spin-coating process.

4. The method of claim 1, wherein the forming the pattern in the resist layer by exposing the resist layer to the radiation source includes performing an extreme ultraviolet lithography process.

5. The method of claim 1, wherein the first monomer includes a material selected from the group consisting of an aliphatic compound, a C4-C20 alkyl group, a cycloalkyl group, a C4-C20 saturated hydrocarbon ring, a C4-C20 unsaturated hydrocarbon ring, and a C5-C20 heterocyclic group.

6. The method of claim 1, wherein the first monomer has as a glass transition temperature below about 80 degrees Celsius.

7. The method of claim 1, wherein the second monomer includes a base having an acid dissociation constant ($pK_a$) value greater than 7 and less than 13.

8. The method of claim 1, wherein the second monomer includes a material selected from the group consisting of an $NH_3$ group, a 1°-3° amine group, an $OH^-$ group, an $NCS^-$ group, an alkenyl group, a phenol group, a C5-C20 heterocyclic group, and a CN group.

9. The method of claim 1, wherein the developing the resist layer includes performing a wet development process.

10. A method comprising:
performing a lithography process on a resist layer, wherein the lithography process includes exposing the resist layer to a radiation source using a mask, such that the resist layer has exposed portions and unexposed portions after the lithography process;
depositing a treatment material on the resist layer having the exposed portions and the unexposed portions, wherein the treatment material diffuses into the exposed portions of the resist layer and coats interfaces between the exposed portions of the resist layer and the unexposed portions of the resist layer, wherein the treatment material includes a first monomer, a second monomer different than the first monomer, and a third monomer different than both the first monomer and the second monomer; and
after depositing the treatment material, performing a wet development process that includes applying a developing solution to the resist layer having the exposed portions and the unexposed portions, thereby forming a treated, patterned resist layer.

11. The method of claim 10, wherein:
the exposed portions of the resist layer form lines having a first line width roughness after the lithography process;
the treatment material diffuses to sidewalls of the exposed portions; and
the exposed portions of the resist layer form lines having a second line width roughness after applying the treatment material and applying the developing solution, wherein the second line width roughness is different than the first line width roughness.

12. The method of claim 10, wherein the developing solution further removes a portion of the treatment material.

13. The method of claim 10, wherein the first monomer has as a glass transition temperature below about 50 degrees Celsius,
wherein the second monomer includes a base having an acid dissociation constant ($pK_a$) value greater than 7 and less than 10, and
wherein the third monomer includes a material selected from the group consisting of a styrene and a phenolic compound.

14. The method of claim 10, further comprising removing a portion of the treatment material by applying a solvent having a partition coefficient greater than about 1.82.

15. The method of claim 10, further comprising performing a baking process on the resist layer having the exposed portions and the unexposed portions after applying the treatment material and before applying the developing solution.

16. The method of claim 10, wherein the treatment material has a molecular weight that is less than about 10,000.

17. A method comprising:
performing a lithography process on a resist layer, wherein the lithography process includes exposing the resist layer to a radiation source, such that the resist layer has an exposed portion and an unexposed portion after the lithography process and the exposed portion and the unexposed portion share an interface therebetween;
baking the resist layer having the exposed portion and the unexposed portion;
after baking the resist layer and before developing the resist layer, depositing a treatment material over the resist layer having the exposed portion and the unexposed portion, wherein the treatment material coats the interface between the exposed portion and the unexposed portion, and wherein the treatment material includes a first monomer, a second monomer different than the first monomer, and a third monomer different than both the first monomer and the second monomer, and further wherein the third monomer includes a material selected from the group consisting of a styrene and a phenolic compound; and
developing the resist layer, wherein the developing removes a first portion of the treatment material and provides a treated patterned resist layer, wherein the treated patterned resist layer includes a second portion of the treatment material.

18. The method of claim 17, wherein the resist layer is a positive-tone resist layer.

19. The method of claim 17, wherein the resist layer is a negative-tone resist layer.

20. The method of claim 17, wherein the first monomer has a glass transition temperature below about 80 degrees Celsius and the second monomer includes a base having an acid dissociation constant ($pK_a$) value that is greater than 7 and less than 13.

* * * * *